United States Patent
Kakinuma et al.

(10) Patent No.: US 6,591,329 B1
(45) Date of Patent: Jul. 8, 2003

(54) FLASH MEMORY SYSTEM FOR RESTORING AN INTERNAL MEMORY AFTER A RESET EVENT

(75) Inventors: Yuji Kakinuma, Tokyo (JP); Hiroya Kitagawa, Tokyo (JP); Teruo Shimada, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/377,824

(22) Filed: Aug. 20, 1999

Related U.S. Application Data

(63) Continuation of application No. PCT/JP98/05544, filed on Dec. 8, 1998.

(30) Foreign Application Priority Data

Dec. 22, 1997 (JP) .............................. 9-365703

(51) Int. Cl.⁷ .............................. G06F 12/02
(52) U.S. Cl. ...................... 711/103; 711/166
(58) Field of Search .................. 711/103, 162, 711/166, 206; 348/231, 232, 233, 231.99, 231.3, 231.7; 707/201, 203

(56) References Cited

U.S. PATENT DOCUMENTS

| | | | |
|---|---|---|---|
| 5,200,959 A | 4/1993 | Gross et al. | 371/21.6 |
| 5,297,148 A | 3/1994 | Harari et al. | 371/10.2 |
| 5,742,934 A * | 4/1998 | Shinohara | 711/103 |
| 5,835,935 A * | 11/1998 | Estakhri et al. | 711/103 |
| 5,907,856 A * | 5/1999 | Estakhri et al. | 711/103 |
| 5,943,692 A * | 8/1999 | Marberg et al. | 711/203 |
| 5,963,983 A | 10/1999 | Sakakura et al. | 711/202 |
| 5,987,563 A * | 11/1999 | Itoh et al. | 711/103 |
| 6,000,006 A * | 12/1999 | Bruce et al. | 711/103 |
| 6,374,268 B1 * | 4/2002 | Testardi | 707/205 |

FOREIGN PATENT DOCUMENTS

| | | |
|---|---|---|
| EP | 0 522 780 | 1/1993 |
| JP | 64-81028 | 3/1989 |
| JP | 2-292798 | 12/1990 |
| JP | 5-94356 | 4/1993 |
| JP | 5-143468 | 6/1993 |
| JP | 5-282880 | 10/1993 |
| JP | 6-250799 | 9/1994 |
| JP | 7-36759 | 2/1995 |
| JP | 8-50564 | 2/1996 |
| JP | 2530102 | 6/1996 |
| JP | 2582487 | 11/1996 |
| JP | 9-101912 | 4/1997 |
| JP | 9-282111 | 10/1997 |
| JP | 9-319666 | 12/1997 |

* cited by examiner

*Primary Examiner*—Gary Portka
(74) *Attorney, Agent, or Firm*—Oblon, Spivak, McClelland, Maier & Neustadt, P.C.

(57) ABSTRACT

A flash memory system including a memory manager. The memory manager manages data transmission and reception between a host computer and a flash memory. The memory manager mutually converts a logical address in which the flash memory is accessible from the host computer, and a physical address has an actual address of the flash memory. It stores a change of internal information as Δ record in said flash memory and after resetting, restores an internal state to a state before the resetting by information of the Δ record. The flash memory system can be realized in which the delay of the writing/reading time can be decreased, or writing operation can be relatively easily performed, high speed operation is possible and defective sectors, defective bits and the like can be adequately managed.

20 Claims, 13 Drawing Sheets

FIG. 4

ADDRESS CONVERSION TABLE ~31

| 0000 | 0001 | 0002 | 0003 | 0004 | 0005 | 0006 | 0007 |
|------|------|------|------|------|------|------|------|
| #0000 | #0001 | #0002 | #0004 | #0005 | #0006 | #0007 | #0008 |
| 0008 | 0009 | 0010 | 0011 | 0012 | 0013 | 0014 | 0015 |
| #0009 | #0010 | #0011 | #0012 | #0013 | #0014 | #0015 | #0016 |
| 0016 | 0017 | 0018 | 0019 | 0020 | 0021 | 0022 | 0023 |
| #0017 | #0018 | #0019 | #0021 | #0022 | #0023 | #0024 | #0025 |
| 0024 | 0025 | 0026 | 0027 | 0028 | 0029 | 0030 | 0031 |
| #0026 | #0027 | #0028 | #0029 | #0030 | #0031 | #0032 | #0033 |
| 0032 | 0033 | 0034 | 0035 | 0036 | 0037 | 0038 | 0039 |
| #0034 | #0035 | #0036 | #0037 | #0038 | #0039 | #0040 | #0041 |

| Nh-7 | Nh-6 | Nh-5 | Nh-4 | Nh-3 | Nh-2 | Nh-1 | Nh |
|------|------|------|------|------|------|------|------|
| #Nh-5 | #Nh-4 | #Nh-3 | #Nh-2 | #Nh-1 | #Nh | #Nh+1 | #Nh+2 |

FIG. 5

| 0000 | 0001 | 0002 | 0003 | 0004 | 0005 | 0006 | 0007 | 0008 | 0009 |
|------|------|------|------|------|------|------|------|------|------|
| 0010 | 0011 | 0012 | 0013 | 0014 | 0015 | 0016 | 0017 | 0018 | 0019 |
| 0020 | 0021 | 0022 | 0023 | 0024 | 0025 | 0026 | 0027 | 0028 | 0029 |
| 0030 | 0031 | 0032 | 0033 | 0034 | 0035 | 0036 | 0037 | 0038 | 0039 |
| 0040 | 0041 | 0042 | 0043 | 0044 | 0045 | 0046 | 0047 | 0048 | 0049 |

| Nh-6 | Nh-5 | Nh-4 | Nh-3 | Nh-2 | Nh-1 | Nh | Nh+1 | Nh+2 | Nh+3 |
|------|------|------|------|------|------|----|------|------|------|
| Nh+4 | Nh+5 | | | | | | | | |

| | | | | | | | | | Nmax |
|---|---|---|---|---|---|---|---|---|------|

FIG. 8

BLOCK STATUS TABLE ~32

| #0000 FF | #0001 FF | #0002 FF | #0003 FF | #0004 FF | #0005 FF | #0006 FF | #0007 FF |
|---|---|---|---|---|---|---|---|
| #0008 FF | #0009 FF | #0010 FF | #0011 FF | #0012 FF | #0013 FF | #0014 FF | #0015 FF |
| #0016 FF | #0017 FF | #0018 FF | #0019 FF | #0020 FF | #0021 FF | #0022 FF | #0023 FF |
| #0024 FF | #0025 FF | #0026 FF | #0027 FF | #0028 FF | #0029 FF | #0030 FF | #0031 FF |
| #0032 FF | #0033 FF | #0034 FF | #0035 FF | #0036 FF | #0037 FF | #0038 FF | #0039 FF |
| ... | ... | ... | ... | ... | ... | ... | ... |
| #Nmax-7 FF | #Nmax-6 FF | #Nmax-5 FF | #Nmax-4 FF | #Nmax-3 FF | #Nmax-2 FF | #Nmax-1 FF | #Nmax FF |

FIG. 16

FLASH MEMORY SYSTEM FOR RESTORING AN INTERNAL MEMORY AFTER A RESET EVENT

This is a continuation of PCT/JP98/05544 filed on Dec. 8, 1998.

BACKGROUND OF THE INVENTION

1. Field of the Invention

The present invention relates to a flash memory which is a nonvolatile memory, more particularly to a flash memory system provided with a management system for appropriately managing a flash memory.

2. Discussion of the Background

As a storage medium for use in a computer system, a magnetic recording medium such as a hard disc or a floppy disc has been heretofore used. Above all, the hard disc having a large capacity and capable of operating at a high speed can store a large amount of data, and therefore it is positioned as a central storage medium of the system.

However, the manufacturing process of the hard disc is complicated, and it is difficult to realize its miniaturization, weight-saving and cost reduction. Since a structure is moved during the use of the hard disc, a relatively large consumption power is required, and particularly in the case that the hard disc is applied to a portable apparatus or the like, this problem tends to rise.

As the storage medium other than the hard disc, a flash memory is known as a nonvolatile storage element. In the flash memory, a power supply to maintain storage is unnecessary, and the miniaturization and the weight-saving are possible.

The flash memory, for structural reasons thereof, has a finite physical life of about $10^{10}$ in terms of an rewriting times. Therefore, in order to use the flash memory relatively safely and stably for a long period of time, an expired storage element and a section in which a defect occurs are detected, and these troubles need to be avoided to store data. Furthermore, in the case of the flash memory, new data cannot be written over a section in which data has already been stored. Therefore, when the new data is to be stored, a stored area must be once erased before the data is written. However, a unit which can be erased is not an individual storage element (=bit) unit, but it is a block unit such as 4 kilobytes or 8 kilobytes. Therefore, generally, after a data portion other than the data to be rewritten is taken out of the block to be erased, the block is erased, and the data portion needs to be newly added/written again.

In Japanese Patent Application Laid-open No. 292798/1990, a flash EEprom system is described for the purpose of enhancing a writing/reading speed to a flash memory and managing a defective cell and the like. In the flash EEprom system described therein, an access time is intended to be enhanced using a cache memory. However, shortening of the access time dependent on the cache memory is naturally limited, and in order to further enhance the writing/reading speed to the flash memory, an operation speed of the entire flash memory system needs to be enhanced.

Moreover, in the above-described publication, for the management of the defective cell and the like, a redundant portion is provided with ECC and another information, and replacement bit, replacement sector and another information, and the defective cell and the like are managed only with the information of the redundant portion. However, since the defective cell and the like are managed only with the redundant portion, the storage capacity of the redundant portion has to be enlarged, which diminishes an area to store actual data. Furthermore, since the system manages the defective cell and the like only with the redundant portion, before reading the actual data, the redundant data is read, and a propriety of data stored in the memory is judged or recovery or the like of the data is performed, which remarkably delays the access time.

Additionally, the flash memory system is a nonvolatile memory, but during turning-on of a power supply or during resetting, for a controller to grasp a content and state of the flash memory, the content of the flash memory, especially the redundant data needs to be read. However, as described above, the reading speed of the flash memory is slower as compared with ordinary RAM or the like, much time is therefore required to grasp all information, and as a result, the system becomes slow in starting.

Such delay in rising is a fatal problem, for example, for a digital camera or another system which needs to be instantly ready for operation after power is turned on, and a flash memory system which can be started at a higher speed has been demanded.

SUMMARY OF THE INVENTION

An object of the present invention is to realize a flash memory system which is fast in rising speed during turning-on of a power supply or after resetting, has little delay in writing/reading time, can relatively easily perform a writing operation, can realize a high-speed operation and which can adequately manage a defective sector, defective bit or the like.

The present inventors have extended researches to enhance a writing/reading speed to the flash memory, and as a result, have proposed an address conversion table. The address conversion table formed on S-RAM or another storage medium which is accessible at a high speed correlates a logical address designated by a host computer side with an actual address of the flash memory or physical address, and mutually converts the addresses.

The address conversion table is also defined for each block as a minimum erasing unit of the flash memory, and the above-described addresses are treated as a logical block address and a physical block address, respectively. In this manner, by performing address conversion for each block corresponding to the minimum erasing unit, the management of the flash memory particularly in the writing operation is facilitated, and the writing operation can be performed at a high speed.

Moreover, an area of the logical address and an area of the physical address differ in size, and the logical address area is set smaller than the physical address area. By such setting, a difference of both areas can be used as a spare area. Specifically, the spare area is used as a queue in an operation standby state, and changed with a defective block, or used as a substitute for an area in which new data is to be written during the writing operation. This further enhances the operation speed.

Furthermore, in addition to the address conversion table, there is provided a block status table which has, as data indicating a state of each physical block on the flash memory, data indicating at least whether or not the block is good, whether or not a bad sector is present and whether or not the block is used. Since the block status table is provided, without accessing the flash memory relatively slow in the operation speed, the state of each block in the flash memory can instantly be grasped, a defective block and defective sector can easily be managed, and the operation speed is further enhanced.

Additionally, the address conversion table, block status table, queue and another internal information are usually formed on the storage medium (S-RAM) which is accessible at a high speed. However, since such storage medium is volatile, during cutting-off of power supply or during resetting, the medium is extinguished, or reliability is lost. Therefore, the storage data, i.e., the above-described internal information needs to be stored on the nonvolatile storage medium or flash memory. Then, during turning-on of the power supply or during resetting, the flash memory is accessed, and the address conversion table, block status table, queue and another internal information are restored to a previous state by the stored data.

However, the internal information changes every time the writing/reading operation to the flash memory is performed, but if every information is stored, an enormous storage area becomes necessary. Moreover, to perform such operation for each writing/reading, the longer time the storing takes, the more time is wasted, and as a result, the operation speed is decelerated. Furthermore, if during the turning-on of the power supply or during resetting all areas of the flash memory are accessed, and the address conversion table, block status table, queue and another internal information are restored, an enormous time further becomes necessary, and a system becomes very slow in rising.

To solve the problem, it is convenient to store these internal information data collectively in such a manner that they can instantly be read. Moreover, for a content to be stored, initial value+α record, i.e., all data only of the initial value are stored, and for subsequently generated changes, only data of the change (Δ record) is stored. Then, the data capacity can be reduced, and the access time can considerably be shortened. Moreover, in this case, by also recording error correction code data indicating a position and size of a trouble occurring in the Δ record, data reliability is significantly enhanced. Additionally, during the turning-on of the power supply or during resetting these data can be used to restore the previous state.

Specifically, the above-described object is attained by the following constitutions.

(1) A flash memory system comprising a memory manager for managing data transmission/reception between a host computer and a flash memory, wherein said memory manager mutually converts a logical address in which the flash memory is accessible from said host computer, and a physical address as an actual address of the flash memory, said memory manager stores a change of internal information as Δ record in said flash memory, and said memory manager, after resetting, restores an internal state to a state before the resetting by information of said Δ record.

(2) The flash memory system according to the above (1) wherein said Δ record is successively stored as data indicative of subsequent changes with respect to an initial value of the internal information to restore the internal information after the resetting.

(3) The flash memory system according to the above (1) or (2) wherein said Δ record has error correction code data.

(4) The flash memory system of any one of the above (1) to (3) wherein said Δ record is continuously written to a predetermined storage area.

(5) The flash memory system according to any one of the above (1) to (4) wherein:

said memory manager sets a size of an area of said logical address to be smaller than a size of an area of the physical address as the actual address of the flash memory, and said memory manager has said Δ record in a surplus area of the physical address area which does not correspond to the logical address area.

(6) The flash memory system according to any one of the above (1) to (5) wherein said memory manager treats the physical address and the logical address every block divided corresponding to a minimum erasing unit of the flash memory.

(7) The flash memory system according to any one of the above (1) to (6) wherein:

said memory manager has an address conversion table for mutually converting a logical block address and a physical block address, and this address conversion table and information of changes thereof are included in said Δ record.

(8) The flash memory system according to any one of the above (1) to (7) wherein:

said memory manager further has a block status table, this block status table has data indicating a state of said physical block on the flash memory, said data indicating at least whether or not the block is good, whether or not a bad sector is present and whether or not the block is used, and the block status table and information of changes thereof are included in said Δ record.

(9) The flash memory system according to any one of the above (5) to (8) wherein:

said memory manager has a queue in a ready-to-use state in the surplus area of said physical address area not corresponding to the logical address area, and information of this queue is included in said Δ record.

(10) The flash memory system according to any one of the above (1) to (9) wherein:

when data is written to the flash memory, said memory manager writes new data in a predetermined block in the queue, and this data is set as the logical block address of an estimated writing destination, and an estimated writing destination block is set as the queue.

(11) The flash memory system according to any one of the above (1) to (10) wherein:

in a case where the estimated writing destination block has data other than data to be updated, after transfer of a predetermined amount of data from the host computer is completed, said memory manager transfers the existing data from the estimated writing destination block to the predetermined block in the queue in which the new data is written.

(12) The flash memory system according to any one of the above (1) to (11) wherein when a trouble occurs in an arbitrary block in the physical address area, said memory manager replaces the block with an arbitrary block in said queue.

(13) The flash memory system according to any one of the above (1) to (12) which is an IC chip.

(14) The flash memory system according to any one of the above (1) to (13) which is integral with the flash memory and is a card-shaped external storage system.

BRIEF DESCRIPTION OF THE DRAWINGS

FIG. 4 is a schematic view showing one constitution example of an address conversion table.

FIG. 5 is a schematic view in which logical addresses are arranged for the physical address area in the flash memory, and shows the physical address area corresponding to the logical address area.

FIG. 8 is a schematic view showing one constitution example of a block status table.

FIG. 16 is a view showing one example of a calculation formula for obtaining the generated polynomial.

DETAILED DESCRIPTION OF THE PREFERRED EMBODIMENTS

Figure 1:
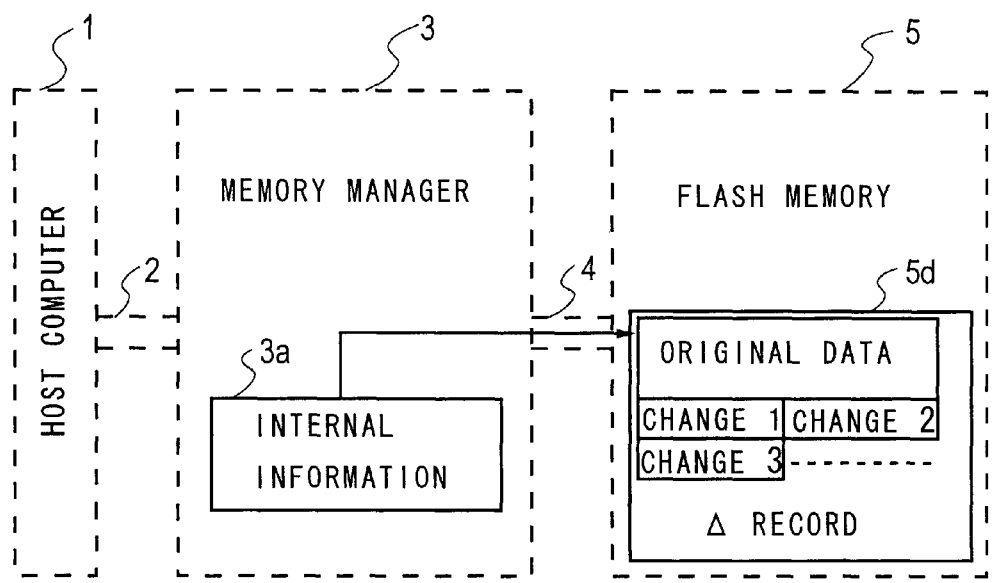
FIG. 1 is a block diagram showing a basic constitution of a flash memory system of the present invention.
Figure 2:
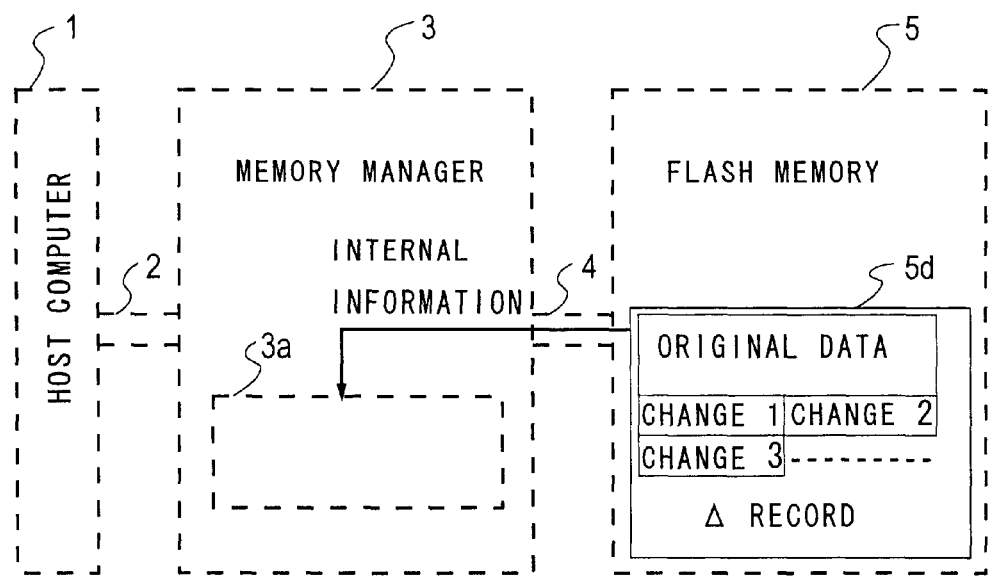
FIG. 2 is a block diagram showing the basic constitution of the flash memory system of the present invention, and shows that internal information is reproduced from the flash memory.

A flash memory system of the present invention, for example, as shown in FIG. 1, comprises a memory manager 3 which manages data transmission/reception of a host computer 1 and a flash memory 5. The memory manager 3 mutually converts a logical address by which the flash memory 5 is accessible from the host computer 1, and a physical address as an actual address of the flash memory 5, and stores a change of internal information relative to a initial value as Δ record in the flash memory. Then, for example, as shown in FIG. 2, after resetting the internal information is restored to a state before the resetting by information of the Δ record.

Instead of recording all data of the internal information, original data of the internal information as the initial value, and only information of a subsequently changed portion as the Δ record are recorded, so that all the internal information can be recorded in a small storage area. Additionally, even if during turning-on of a power supply or during resetting there occurs a situation in which internal data is lost, the internal information can be restored based on the data, and an access time to a memory can be shortened to realize a high-speed operation.

The internal information recorded as the Δ record is not particularly limited, but examples thereof include a content of setting accompanied by a writing/reading operation to the flash memory and changes thereof, information about a defective block, substitute block, defective sector, and substitute sector and changes thereof, and the like. These are data which correlate the logical address and the physical address, data required for performing the writing/reading operation to the memory, or data required for restoring defective portions of the memory and data. These data change as time elapses during the operation performed on the flash memory as described later.

The internal information are usually stored in S-RAM, D-RAM or another volatile storage medium which is accessible at a relatively high speed. Therefore, during cutting-off of the power supply or during resetting, the data is extinguished, or reliability is lost. To solve the problem, these data are stored in a nonvolatile storage medium or flash memory, maintained even during cutting-off of the power supply or during resetting, and read at the time of restoration, so that the former state can be restored.

The Δ record is preferably continuously recorded in a predetermined area on the flash memory. The continuous recording can minimize a storage capacity necessary for the Δ record. Moreover, a recorded data length is preferably adjusted to a predetermined length excluding initial data. In the Δ record the original data of the internal information is recorded as the initial value, and subsequently, every time a change occurs in the internal information, a change portion is recorded. In an ordinary operation, since the change occurs only in one portion of the internal information, the portion may be recorded. Then, when restoration is performed from these data, a similar change may be added to the original data.

Moreover, the Δ record preferably has ECC (error correction code) data. With the held ECC data, when a trouble occurs in the Δ record itself, a position and size of the trouble can be grasped. Therefore, the data can be restored, or discarded as the case may be.

The ECC data is a type of Hamming code, and preferably includes cyclic codes such as BCH code, RS code and the like. These codes can easily be obtained by a generated polynomial represented by G(x) (can be obtained by applying a shift register, or a program formed as a software of the register). By the ECC data, an error place and size can be specified, and thereby reliability of the Δ record can considerably be enhanced.

The ECC data is added to the Δ record, but usually, when the Δ record is recorded in an actual data area of the flash memory 5, the ECC data to the data area is automatically added to a redundant area portion by a flash memory interface. However, as described later, the Δ record itself is a combination of the data of the change and the ECC data. Therefore, the data of the redundant area is left in an erased pattern (111 . . . ) as it is. Specifically, since the change data+ECC data form a value divisible by the generated polynomial, by placing the ECC data to the data area written in the ordinary redundant area into the erased pattern (111 . . . ), the ordinary system can be operated as it is without any problem.

Generally, the Δ record is successively recorded every time the change occurs in the internal information. Subsequently, after the power supply is cut off or after resetting the data is read to restore the internal information. Usually, after the power supply is turned on or after resetting, a controller of the memory manager or microprocessor is constituted to perform the restoring operation of the Δ record by settings on hardware or software.

Examples of the reset include a hardware reset automatically given from the hardware (power supply monitor IC, reset switch or the like) when the power supply is turned on, a software reset given by operation on the software, and the like, but either reset may be performed.

A mode and configuration of the host computer 1 are not limited as long as the host computer is provided with a microprocessor, peripheral elements of the microprocessor, keyboard, communication port, expansion bus, display and another input/output means, can be connected to a hard disc and another internal/external storage medium, and can perform necessary operations (regardless of general and specific applications) as a computer (personal computer).

The memory manager 3 manages the data transmission/reception of the host computer 1 and the flash memory 5. Specifically, transfer speeds of data transmitted from the host computer 1 and data transmitted from the flash memory 5 are adjusted, and logical address data for reading/writing designated by the host computer 1 is converted to physical address data.

Figure 3:
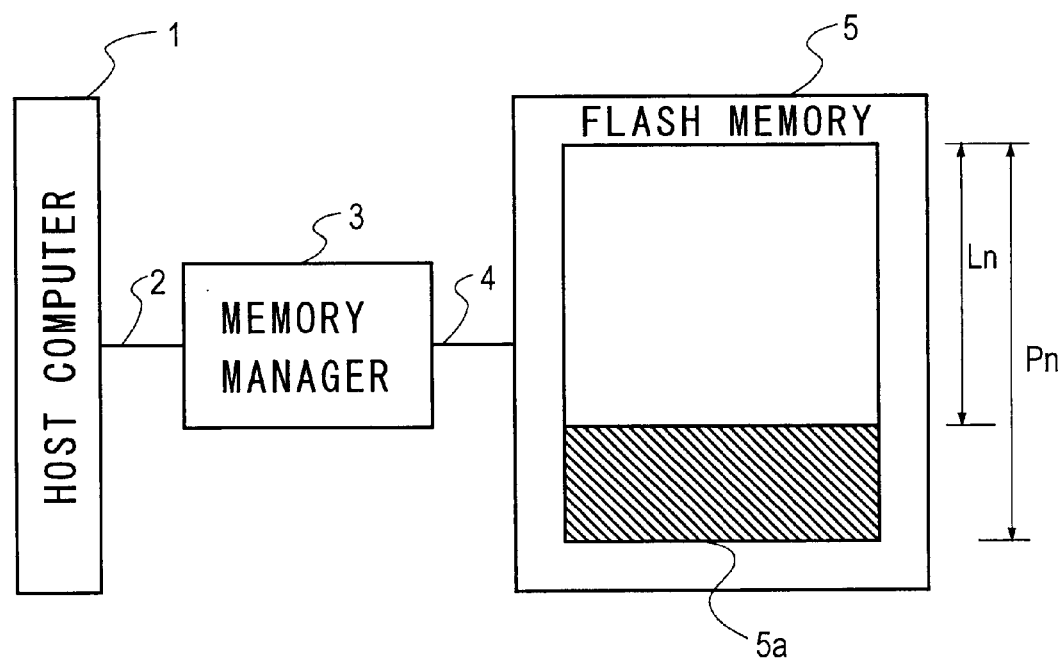
FIG. 3 is a schematic view showing a size of a logical address area and a size of a physical address area inside the flash memory.

Moreover, preferably as shown in FIG. 3, a size Ln of a logical address area by which the flash memory is accessible from the host computer 1 is set smaller than a size Pn of a physical address area as the actual address of the flash memory, and a surplus area 5a of the physical address area not corresponding to the logical address area constitutes the above-described queue. One of the blocks taken out of the queue is provided with the internal information and the Δ record.

Furthermore, the memory manager 3 preferably uses an address conversion table formed on a storage medium which can be referred to from a controller or the like, so that the logical address given to the flash memory 5 from the host computer 1 is converted to the physical address as the actual address of the flash memory 5, or a reverse conversion is performed.

The flash memory 5 is a nonvolatile memory, and can be regarded as one type of EEPROM. Specifically, data can be read at any time, but the data can be written usually once after the data is erased, and the data cannot be overwritten. Therefore, before the data writing operation is performed, an operation for erasing the stored data is surely accompanied (excluding an initial state). When the data is erased, in the flash memory, for structural reasons thereof a predetermined storage area is collectively erased. In a NAND type flash memory for preferable use in the present invention, a minimum erasable area is usually 8 or 16 minimum storage units (one sector+redundant portion), i.e., 4 kbytes or 8 kbytes (excluding the redundant portion).

Therefore, the memory manager 3 preferably treats the logical address and physical address by each block corresponding to the minimum erasing unit. By treating the flash memory by each block, the flash memory can efficiently be managed. In this case, the Δ record also stores the internal information defined for each block.

To secure a predetermined storage capacity, the flash memory 5 may constitute a memory array in which a plurality of flash memory elements (IC) are assembled.

The system of the present invention preferably further comprises a bus interface 2 and a flash memory interface 4 (refer to FIG. 1).

Examples of the bus interface 2 include a bus for connecting to the host computer 1 such as SCSI, IDE and another external connection bus, PCMCIA and another PC card interface in conformity with these buses, and the like. Above all, as a preferable mode, when the flash memory system of the present invention is applied to PC card, the PC card interface is used. Therefore, the bus interface 3 can appropriately be connected to the host computer in conformity with standards and specifications. Moreover, when the bus interface 3 is seen from the side of the host computer 1, the existing OS, application software or the like can be used as it is, as long as the flash memory 5 can be treated equally to the hard disc.

The flash memory interface 4 automatically controls, or optimizes the writing/reading to the flash memory 5. Specifically, the writing operation to the flash memory accompanied by the erasing operation is automatically performed, or the reading operation from a certain address to a certain address is continuously automatically performed. The flash memory interface 4 may be constituted, for example, of a flash memory sequencer or another control element having a calculating function, various registers, a storage element for storing an operation procedure and the like.

Moreover, the flash memory system of the present invention preferably has an address conversion table for mutually converting a logical block address and a physical block address.

The physical address usually has a one-to-one correspondence with the logical address. The correspondence is preferably defined for each block. Specifically, both addresses are treated by each block, and a top address is defined for each of the physical block address and the logical block address. Then, as an offset value to these top addresses, the physical address and the logical address are defined. Moreover, each block is converted, using the address conversion table or the like, to the physical block address from the logical block address, or to the logical block address from the physical block address.

FIG. 4 is a schematic view showing a constitution example of an address conversion table 31. The address conversion table 31 is formed corresponding to the minimum erasing unit (minimum erasing block) of the flash memory 5.

For the address conversion table 31, in the example shown in FIG. 4, the logical block address is disposed in an upper part of one block, the physical block address (shown with # attached to a top of numeral in the drawing) is in a lower part, and a certain specific logical block address usually has a one-to-one correspondence with an arbitrary physical block address. Specifically, the corresponding logical block address and physical block address are disposed in a predetermined block. Additionally, a maximum logical block address Nh in an accessible memory area opened toward the host computer 1, and a physical block address with a corresponding size are defined.

Here, the logical block address is an address number designated when the host computer 1 has access to a storage unit in a specific memory as described above, and refers to a top address obtained by dividing the address into blocks each having a size corresponding to the minimum erasing unit. The physical block address is an actual address number on the flash memory, and refers to a top address of the minimum erasing unit.

As described above, in the address conversion table 31, as compared with the physical address area as the actual memory area and as the maximum area of the physical address, the logical address area accessible from the host computer is set smaller. Specifically, the area is set small in such a manner that the Δ record can be kept (stored). Moreover, a portion of the surplus area of the physical block address not corresponding to the logical block address may be used as the queue.

For example, as shown in FIG. 5, in the flash memory 5, a physical block area opened toward the host computer 1 corresponds to the logical block address, and ranges to the maximum value Nh. Moreover, as the surplus area 5a (shown by slashes in the drawing), an area exists from an address Nh+1 in which one is added to the physical block address corresponding to the maximum value Nh of the logical block address, to a maximum value Nmax of the physical block address. Then in the area the Δ record and the queue are provided.

Figure 6:
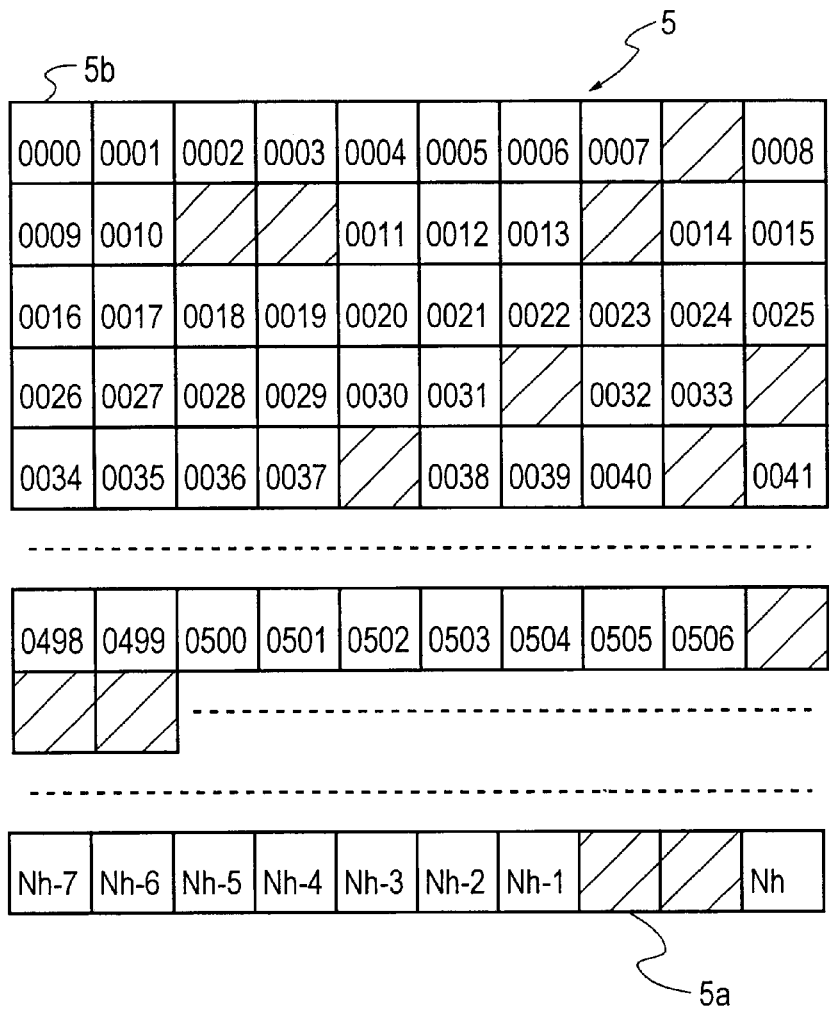
FIG. 6 is a schematic view showing that surplus areas are dispersed and arranged in the physical address area.

Additionally, the surplus area 5a does not have to continuously exist in the last part of the physical address area as shown in FIG. 5, may be positioned in a front part, and for example, as shown in FIG. 6, the area may be scattered like islands in the physical address area. As a result of the scattering of the surplus areas, in the example shown in the drawing, the maximum value Nh of the logical address area is in the same position as the maximum value Nmax of the physical address area. The scattered state of the surplus areas is formed by repeating an operation for replacing with defective blocks described later and the queue during the writing operation. Additionally, in FIG. 6, numerals described in blocks indicate logical block addresses, different from FIG. 5. As described above, since the surplus area 5a having the queue does not correspond to the logical block address, it is not recognized from the host computer 1.

The address conversion table 31 correlates the logical block address and physical block address, but the correspondence of both addresses does not have to be in order from a small address number, and arbitrary addresses may correspond to each other. Specifically, both block addresses forming the predetermined area may only have a one-to-one correspondence. Therefore, instead of using the address conversion table, a function or the like may be used.

Usually in the initial state, the queue is serially formed from a small address in the surplus area (excluding defective sections and the like). Moreover, the queue is preferably treated by each minimum erasing unit (block) of the flash memory 5. By treating the queue by each minimum storage unit, an efficient memory control system can be obtained. When a defective section is arisen in the physical address area corresponding to the logical address area, the section is replaced with the queue, but this operation is also performed for each block. The writing operation of the flash memory 5 requires an erasing operation of each block, but by managing the flash memory 5 by each minimum erasing unit or block, the operation can efficiently be performed.

Figure 7:
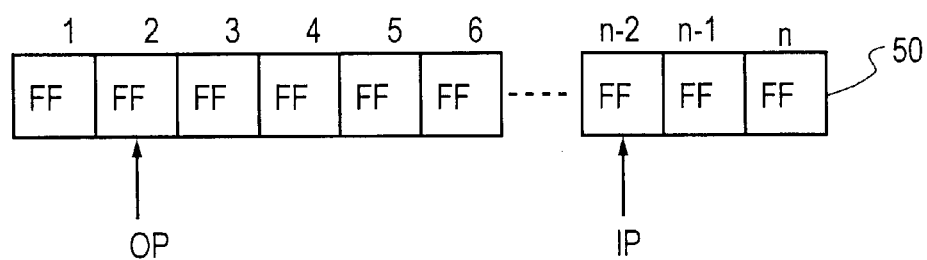
FIG. 7 is a view schematically showing a state of a queue.

A queue 50 is preferably controlled by a pointer. For example, as shown in FIG. 7, the pointer is controlled in such a manner that the number of blocks (hereinafter referred to as elements) constituting the queue 50 falls in a predetermined range. Specifically, in the example shown in the drawing, a sequence of the element or block is attached above the block, and a taking-out point OP (2 in the example of the drawing) and a put-in point IP (n−2) are in predetermined positions in the sequence. In this case, every time the queue 50 is taken out or in, the pointer moves. Specifically, the following results:

(Position of Put-in Point IP)−(Position of Taking-Out Point OP)= the Number of Elements Moreover, the queue itself may be registered in a management table or the like for management.

In the surplus area there is sometimes a block which is permanently discarded as the defective block and which is not used even as the Δ record or the queue. The surplus area is preferably in the range of 1 to 5% of the entire physical address area, more preferably 2 to 3%.

Moreover, the flash memory system of the present invention may comprise a block status table 32 which has data indicating the state of each physical block on the flash memory and indicating at least whether or not the block is good, whether or not a bad sector is present and whether or not the block is used. Since the block status table 32 is provided, the state of each physical block can quickly be grasped on the table, the queue can quickly be formed, and an appropriate memory management can be performed prior to or regardless of memory reading or writing.

The block status table 32 is constituted, for example, as shown in FIG. 8. In an example shown in the drawing, the physical block address (shown with # attached to a top of a numeral in the drawing) is disposed in an upper part of one block, a status value is disposed in a lower part, and each physical block address is provided with the corresponding status value. Then, the corresponding status value is defined up to a maximum physical block address #Nmax in an accessible memory area in the flash memory 5.

The status value is a value indicative of a state of the physical block address, for example, FF is written as an initial state, and subsequently, the value changes in accordance with the state of the block address. The data which can be represented by the status value is at least whether or not the block is good, whether or not the bad sector is present and whether or not the block is used. Moreover, in addition, information about the Δ record, a degree to which the block is good or bad, data about security or another data can be represented. A data indicating mode is not particularly limited, a specific data length, e.g., one byte code may be indicated, or each bit of the specific data length provided with a weight may be indicated.

Since the block status table 32 is provided, the state of each logical block can quickly be grasped. Therefore, when the address conversion table 31 is constructed, by referring to the block status table, the Δ record, queue, element and the like can be removed to allocate the logical block address to the physical block address, and the block having the bad sector, defective block or another block can quickly be detected, and removed. Specifically, without having access to the flash memory, the state of each sector or block can be grasped, and a processing speed is remarkably enhanced.

Embodiment

An embodiment will next be described to further detail the present invention.

Figure 9:
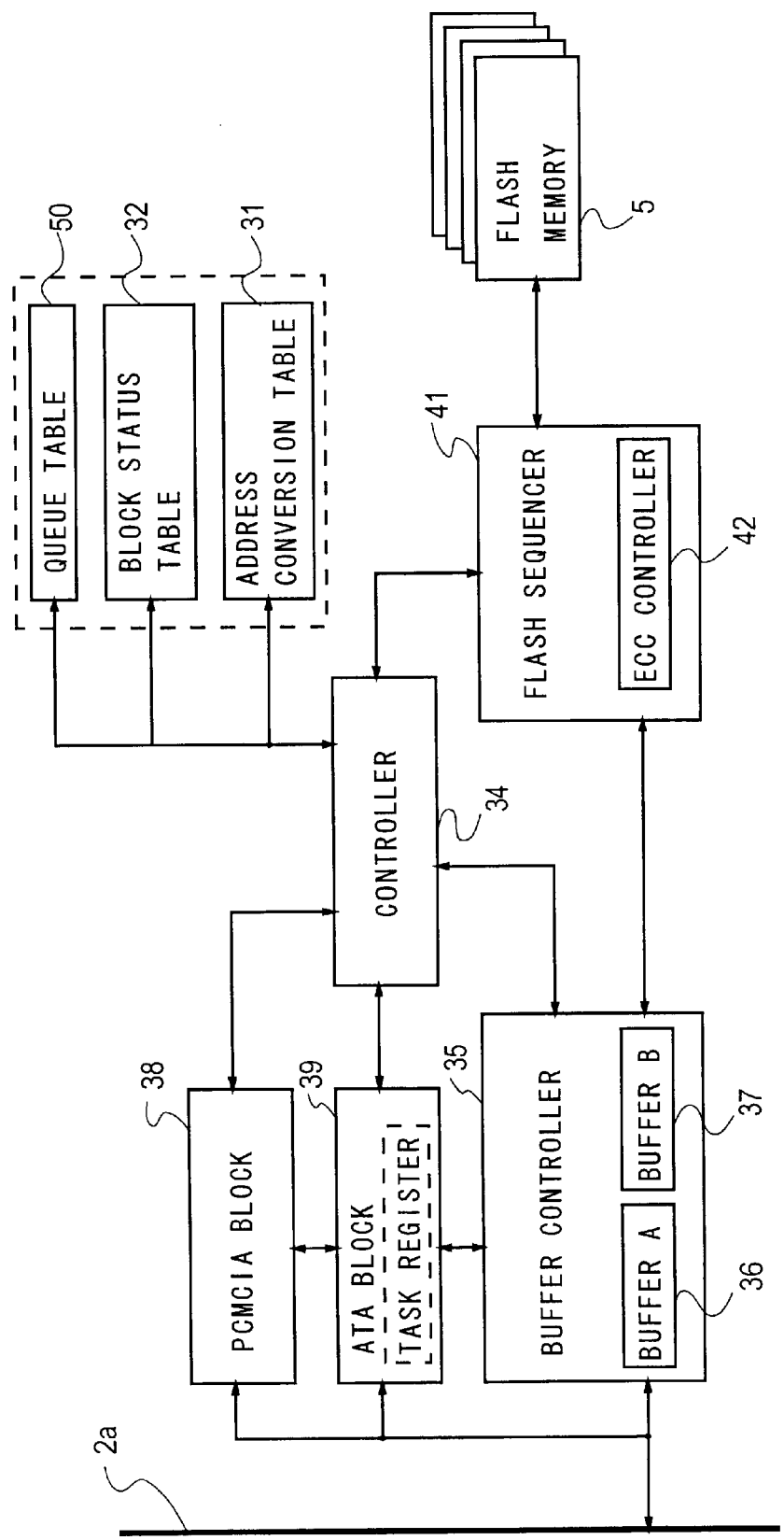
FIG. 9 is a block diagram showing an example in which the flash memory system is applied to a memory card.

As an embodiment, an example of operation in a device shown in FIG. 9 will be described. FIG. 9 is a block diagram showing one embodiment of a flash memory system. In the example shown in the drawing, the flash memory system comprises a PC card bus 2a connected to a host computer, and a buffer A36 and buffer B37 in a buffer controller 35 connected to the PC card bus 2a (in the example the components are integrally shown, but may separately be disposed). Moreover, the PC card bus 2a is connected to a PCMCIA block 38 and an ATA block 39. The buffers A36 and B37 in the buffer controller 35 are connected to a flash sequencer 41 and an ECC controller 42 as the flash memory interface 4 (in the example, these components are integrally shown, but may separately be disposed), and the flash sequencer 41 and the like are connected to a memory array of the flash memory 5.

Moreover, the buffer controller 35, PCMCIA block 38, ATA block 39 and flash sequencer 41 are connected to a controller 34 which comprehensively controls these components. The controller 34 is connected to directly accessible ROM and RAM, in which control algorithm and data necessary for arithmetic operation are stored. Moreover, the address conversion table 31 and the block status table 32 are usually formed on the RAM.

The PC card bus 2a is a bus system for connecting a card-shaped expansion system referred to as the PC card (e.g., SCSI interface unit, MODEM unit, memory card and the like), and can in the example connect the PC card via a predetermined card slot of PCMCIA standards. The PC card is particularly preferably used in a lap top computer or another portable apparatus, a system which transmits/receives information with the apparatus and the like.

The buffer controller 35 and the buffers A36, B37 adjust a data transfer speed and the like on the side of the host computer 1 and on the side of the flash memory 5 while relaying transmission/reception of data between the sides. Specifically, the data transmission/reception speed and timing on the side of the host computer 1 are different from the data transmission/reception speed and timing on the side of the flash memory 5. Therefore, data relay means 3 is provided with two buffers A36, B37 in which a predetermined size of data can be stored. In this case, one buffer A (B) is set as a writing side, and the other buffer B (A) is set as a data reading side. Subsequently, when the buffer controller 35 detects that one buffer A (B) on the data writing side is filled with a predetermined length of data and that data of the other buffer B (A) on the data reading side has been already read, both buffers are changed, one buffer A (B) filled with the data is set as the data reading side, and the other buffer B (A) from which the data has been already read is set as the data writing side.

As described above, by alternately writing data into two buffers and alternately reading data from the buffer filled with the data, even if the data transmission/reception speed on the side of the host computer differs from that on the side of the flash memory, the data can be transferred in accordance with the speeds and timings. In this case, since the side fast in the data transmission/reception speed is surely placed in a standby state, the entire data transmission/reception speed is governed by the side slow in the data transmission/reception speed. Additionally, after the data is read, the buffer becomes empty like FIFO memory, but if a state in which the buffer is filled with new data can be detected, overwriting may be performed.

The data length writable/readable to two buffers is not particularly limited, but is preferably one sector of data or 512 bytes, or a size with a predetermined redundant data added thereto.

The PCMCIA block 38 functions as a PC card bus interface for appropriately connecting to the PC card bus 2a. Specifically, data necessary for a control system (not shown) of the PC card bus 2a to recognize that the PC card is connected, a procedure necessary for the recognition and the like are stored, so that a necessary operation can automatically be performed.

A task register of the ATA block 39 accommodates data of cylinder, head and sector supplied from the host computer or CHS address, conversely supplies the data toward the host computer, and is provided with data for conversion to the logical address of the host computer side. Thereby, the host computer 1 can treat the flash memory system as if it were a hard disc.

In the example, the flash memory 5 constitutes a memory array in which a plurality of memory elements are assembled, so that a necessary storage capacity can be secured. The other constitution is the same as the above-described constitution example, the same constituting elements are denoted with the same reference numerals, and the description thereof is omitted.

As described above, the flash memory system of the example shown in the drawing is accommodated in the PC card, and can be treated in the same manner as the hard disc of SCSI specifications. By disconnectably connecting the system as the PC card to the host computer, a relatively large volume of data can freely be moved, or stored with a small, light card. Additionally, since the system can be treated in the same manner as the hard disc able to be recognized by the conventional software, the existing software can be used, and handling is facilitated.

[Initial Setting]

In an initial state, the data relay means or controller 34 evaluates each sector in the flash memory 5 (writing/reading can normally be performed, written data content has nothing unusual and the like), and this evaluation is used as an evaluation content of a block unit to prepare the block status table 32.

Figures 10, 11:
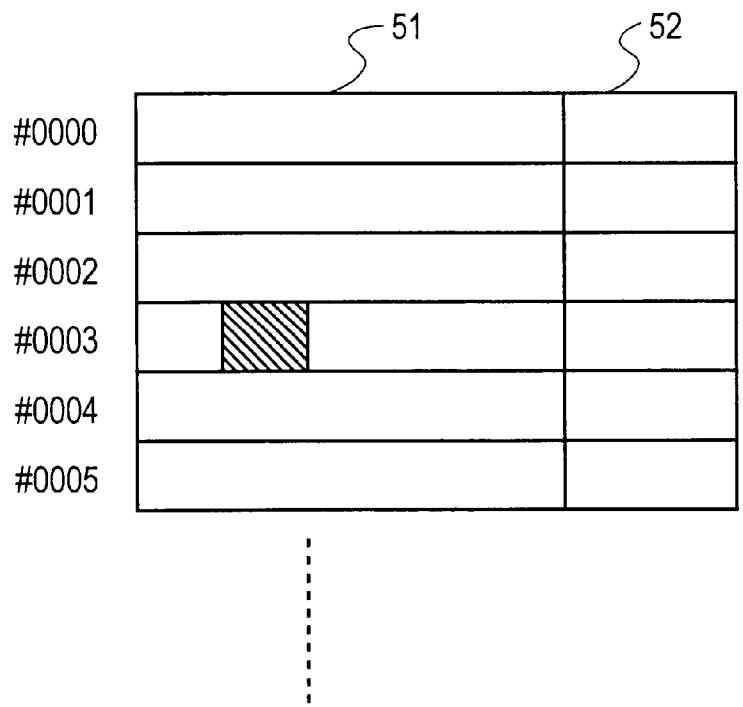
FIG. 10 is a schematic view showing states of an actual data area and a redundant data area of the flash memory, and shows that one sector of the actual data area has a defective section.
FIG. 11 is a schematic view of an operation during resetting, and shows that the block status table is formed.

For example, as shown in FIG. 10, in the flash memory comprising a predetermined size of actual data storage section 51 and a redundant data storage section 52, there is a defect in a physical block address #0003. The controller, for example as shown in FIG. 11, evaluates physical block addresses in order. When there is no defect in a predetermined position of a status table formed on S-RAM, an initial value ("FF" in the example shown in the drawing) is set (written). When an abnormality is detected, a status value indicative of such content ("OF" in the example shown in the drawing) is written. In this manner, the block status table 32 is prepared.

Subsequently, the controller tentatively numbers the flash memory 5 corresponding to the logical block addresses. In this case, based on the information of the block status table 32, defective blocks are excluded from objects to be numbered.

The controller forms the address conversion table 31 and block status table 32 from the obtained data in the address conversion table area and status table area on S-RAM.

In this case, when there is found a block in which the logical block address is "FFFF", i.e., in an erased pattern, the block is regarded as the queue or another element, and registered in the queue table 50. Moreover, it is checked whether or not all the data in the elements of the queue are "FFFF", i.e., in the erased pattern.

Figure 12:
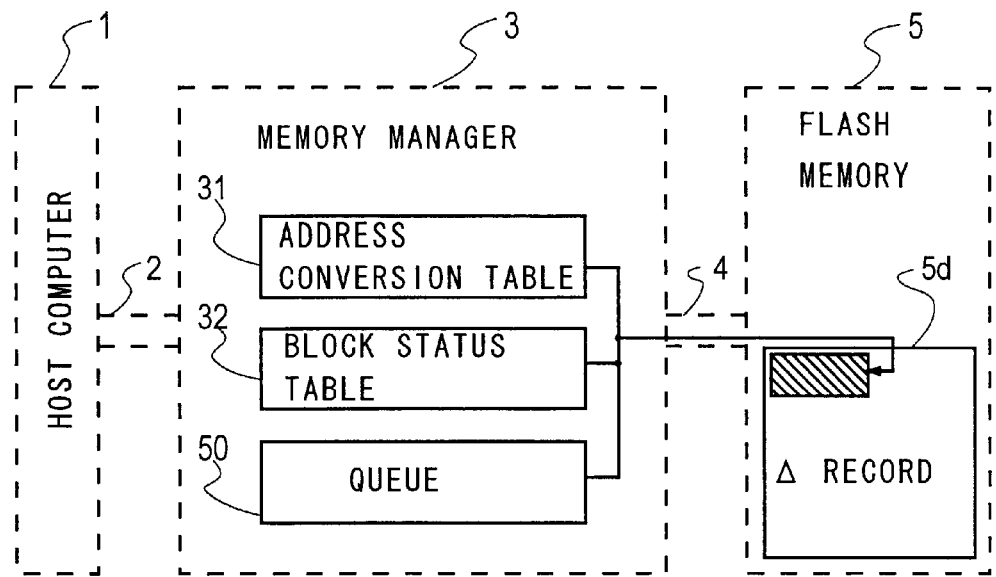
FIG. 12 is a schematic view of the operation during resetting, and shows that original data of the address conversion table, block status table and queue are recorded as Δ record in the flash memory.

By the series of operations, the address conversion table, block status table and queue are formed, then, as shown in FIG. 12, stored as original data in a predetermined area of the flash memory. For a size of stored data, for example, in the flash memory having 512 physical blocks, when the address conversion table is of 1000 bytes, the status table is of 512 bytes, and the queue is of 18 bytes, the total amounts to 1530 bytes.

[Operation during Reading]

As an operation during reading, first the controller 34 receives address data from the host computer 1 via the buffer A36 (or B37) and the like. In this case, if the address data sent from the host computer is of LBA system, by operation using the following equation (I), conversion to the logical block address and offset value is performed.

Specifically, when the logical address sent from the host computer is LBAs, logical block address LBA is obtained as follows:

$$LBA = LBAs/k \qquad (I)$$

k=the number of sectors in the minimum erasing unit (8 or 16)

Remainder m is an offset value which indicates a position of the sector in the block.

Moreover, when the data sent from the host computer is of CHS system, by the following calculation equation (II), the data is converted to data of LBA system. Additionally, the converting function, like ATA block or the like, may independently be provided as a block which has an exclusive function of converting CHS system data to LBA system data.

$$LBA = (C \times HpC + H) \times SpH + S - 1 \qquad (II)$$

Here, C: cylinder number, H: head number, S: sector number, HpC: head/cylinder, SpH: sector/head.

The obtained logical block address is converted to the physical block address by the data conversion table 31, and the offset value is added to form the physical address data.

In the reading operation, usually, the reading from the flash memory 5 and the transfer to the host computer 1 are automatically performed. Specifically, when the controller 34 sets an address of a memory area to be read, the flash memory interface 4, e.g., the flash sequencer 41 automatically reads data from the memory area. The buffer controller 35 successively transmits the transferred data in accordance with transfer speeds of the sides of the flash memory 5 and host computer 1.

In response to an instruction of data transfer from the controller 34, the ATA block 39 releases a busy state, and notifies the host computer 1 of data transfer start. In this manner, after the address converting operation is performed, the controller 34 performs a predetermined setting operation to release from the operation for the data transfer, so that the next address converting operation can be performed ahead. Moreover, since the data converting operation can be processed at a high speed as described above, the operation is usually completed during the data transfer. Therefore, the data transfer speed is remarkably enhanced.

[Operation during Writing]

Figure 13:
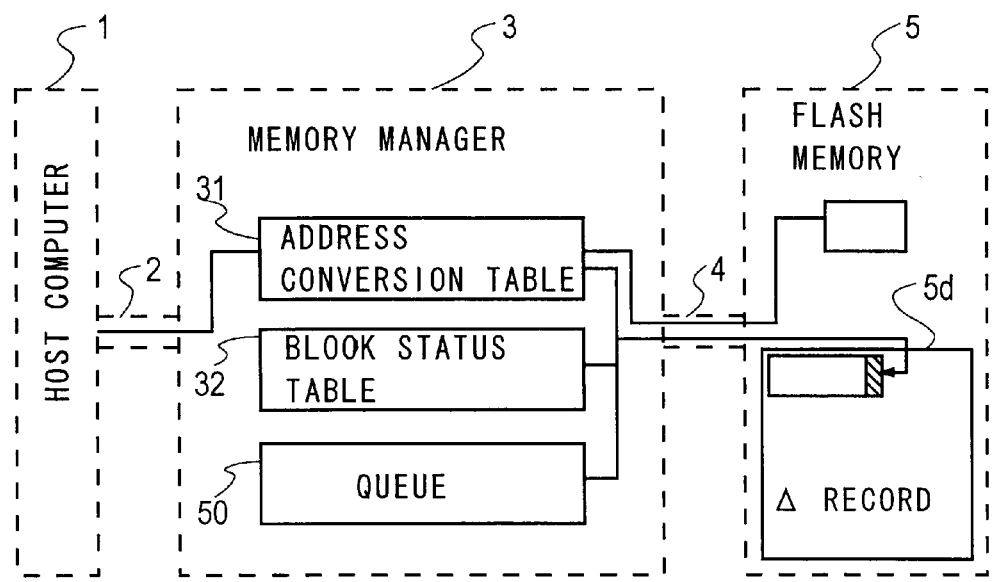
FIG. 13 is a schematic view of an operation during writing, and shows that data of a changed address conversion table, block status table and queue are recorded as the Δ record in the flash memory.

For an operation during writing, the operation before address conversion is the same as in the above-described operation during reading. Subsequently, as shown in FIG. 13, the address conversion is performed, and the operation of writing to a predetermined address on the flash memory 5 is performed.

The flash memory 5 cannot be written over as described above. Therefore, the writing operation is accompanied by an operation of erasing the block unit. In this case, data in a block to be written is once read then erased, and new data may be written/added. In the method, however, since the reading operation is performed before writing, access speed is decelerated.

Therefore, the queue in the surplus area is preferably used. Specifically, an element is taken out of the top of the queue, and new data is once written in a predetermined position (designated by offset) in the block, to form a block to be changed. Subsequently, the logical block address of a block as an original writing destination is set as an address to be erased.

Moreover, in the redundant portion of the block to be changed, the block address and status value of the block to be erased are written. In this case, the logical block of the address conversion table has to be also rewritten. Thereby, the block taken from the queue becomes a new logical block address having the written data.

Subsequently, at the time preferably all, or a predetermined amount of data transfers is completed, residual data of the block to be erased is transferred into the block to be changed, and the block to be erased is erased. Therefore, the reading operation and erasing operation accompanying the writing are performed after all the data are transferred, and apparently, by completing earlier the reception of the written data from the PC on the side of the host computer, the operation speed during writing is enhanced. Additionally, the operation before all the data are rewritten is held in a history holding table or the like, and the writing operation using the queue is smoothly performed.

In this manner, changes occur in the address conversion table, block status table, queue and the like. Data of the changed portions are, as shown in FIG. 13, written in addition to the original data of a Δ record recording area 5d.

For these data, for example, in the address conversion table, since a physical block address value is changed, data of a position (2 bytes) and size (2 bytes) are changed to the minimum. In the block status table, since information for determining whether or not the block is good does not have to be usually rewritten, and a change occurs in data indicating the presence/absence of the data, data of a position (2 bytes) and size (2 bytes) are changed to the minimum. For the queue, since one element is taken out, and another element is taken in, a pointer value moves, and data of a size (2 bytes), the taking-out point OP (2 bytes) and put-in point IP (2 bytes) are changed to the minimum. In the example, these data amount to 11 bytes in total. Since the data of the initial value is of 1530 bytes, it can be seen that the data of the change is extremely small.

The Δ record is recorded in an actual data area on the flash memory. A size of the actual data area in which the Δ record is recorded is usually 256 bytes (1/2 sector) or 512 bytes (1 sector), and there is 8 bytes or 16 bytes of redundant data area corresponding to the actual data area. In the redundant area, ECC data and the like are usually written.

The process of generating the Δ record is as described above, and the data of the change, e.g., of 11 bytes are prepared from the address conversion table, block status table, queue and the like. A method of recording the Δ record into the flash memory will be described hereinafter by way of concrete examples.

Figure 14:
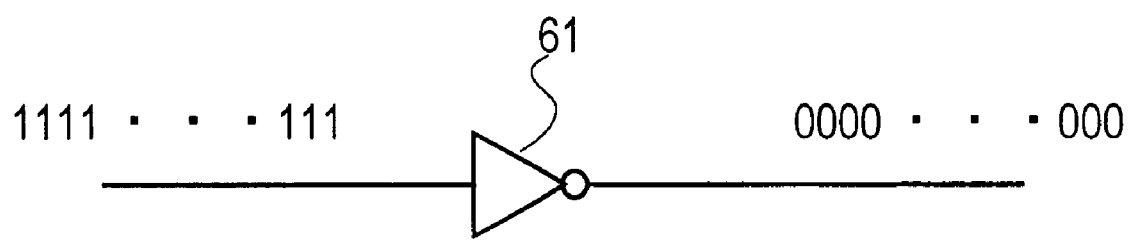
FIG. 14 is a schematic view showing an inverter for inverting an erased pattern which is read from the flash memory.

The pattern of the flash memory after erasing is 111 . . . 11. This is a state in which by the erasing operation, a negative electric charge is pulled out of a floating gate as a storage cell of the flash memory,-and is so-called a reading value of a positively charged storage cell. For example, when this is read, and passed through an inverter 61 as shown in FIG. 14, 000 . . . 00 is obtained, and a pattern in which "0" continues can be obtained.

Here, considered is a case where by a generated polynomial G(x) used to prepare ECC data, predetermined data is divided. For example, in a generated polynomial of a correction BCH code of 3 bits, the following is obtained:

$$G(x) = X^{40} + X^{39} + X^{37} + X^{33} + X^{32} + X^{30} + X^{29} + X^{27} +$$
$$X^{26} + X^{25} + X^{23} + X^{19} + X^{17} + X^{13} + X^{12} + X^{10} +$$
$$X^8 + X^6 + X^4 + X^3 + X^2 + 1$$

Figure 15:
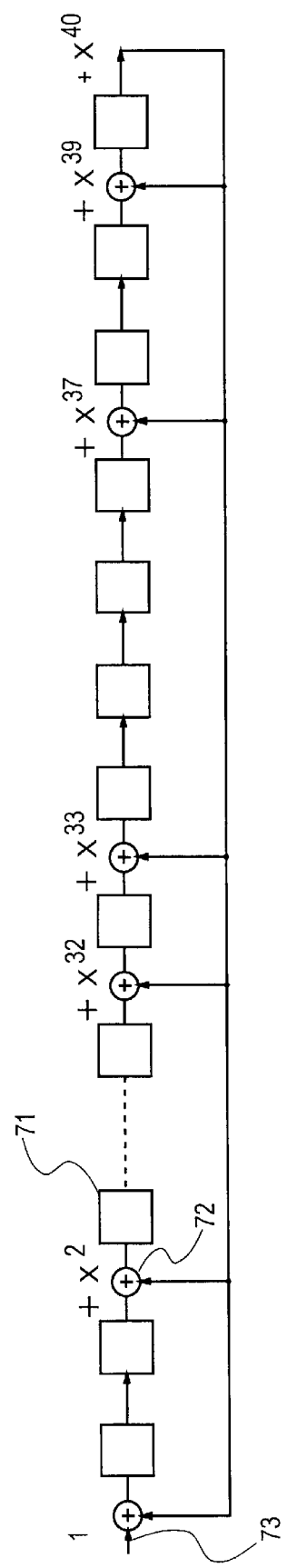
FIG. 15 is a schematic view showing a constitution example of a divider for obtaining a generated polynomial.

When the generated polynomial is represented by a logical formula or a device, for example, a divider is obtained as shown in FIG. 15. The divider is constituted of a shift register (delay element) 71 and an exclusive OR (EXOR) 72, and to an input end 73 of the divider, the reading value of the flash memory is transmitted via the inverter.

Now, supposing that the reading value (000 . . . 00) of the flash memory is serially transmitted to the divider. In this case, a quotient naturally becomes zero. Moreover, a resulting remainder is also 000 . . . 00, and zero continues, for example, for 40 bits. The remainder pattern is important, and if 40 bits are all zero, there is no error, and no correction needs to be performed. However, when there is even one value of 1 in remainder 40 bits, an error exists, and there occurs a necessity of the correction.

Figure 16:
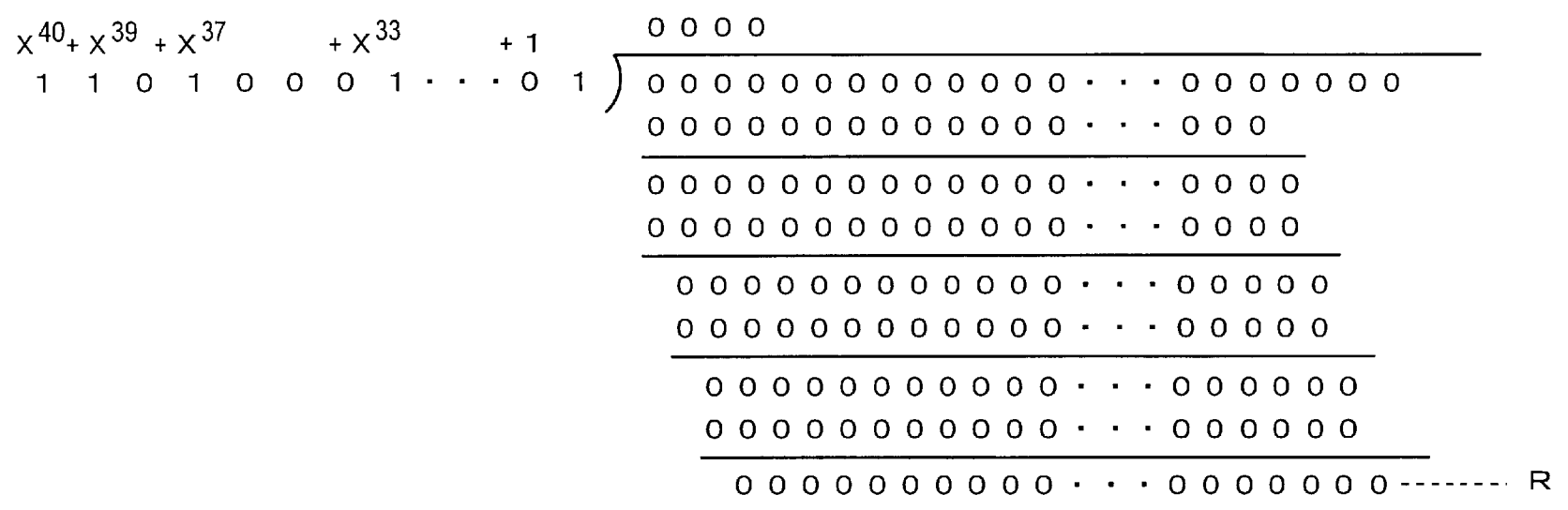
Figure 17:
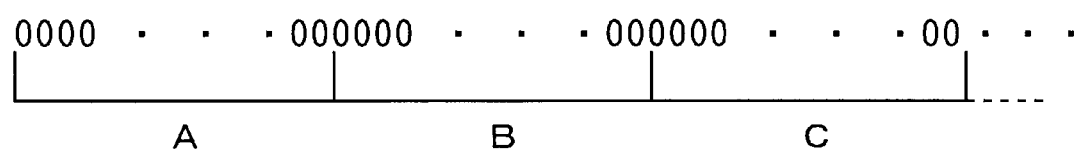
FIG. 17 is a schematic view showing that a data string to be processed by the generated polynomial is divided into an arbitrary size.

FIG. 16 shows a state of division as a calculation formula. As apparent from the drawing, for the pattern in which 000 . . . 00 is repeated, even when the dividing calculation is stopped at any stage, a remainder (R) is 000 . . . 00. For the remainder pattern of 000 . . . 00, in the case of dividing into each area as shown in FIG. 17, a similar division result is repeated even in A, B or C.

For example, considering that the zero bit pattern continues for 16 bytes or 32 bytes of the number of elements in the area A, the size of the change of the above-described internal information is, for example, 11 bytes, which size can be accommodated in the area A.

Figure 18:
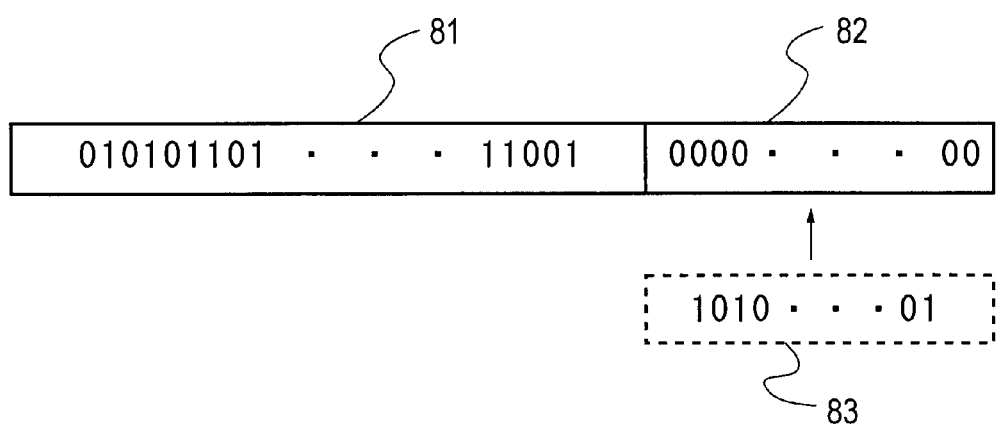
FIG. 18 is a schematic view showing that remainder data obtained by the generated polynomial is added to data indicating a change of the internal information.

Subsequently, in the same manner as the case shown in FIG. 15, when the change data of 11 bytes is divided by the generated polynomial G(x), 5 bytes of data is obtained as a remainder. As shown in FIG. 18, remainder data 83 is added to replace data 82 of 000 . . . 00 after data 81 of the change, and data with a length of 16 bytes in all is obtained. Therefore, the data may be used as one unit to serially replace the predetermined area (A, B, C, etc.) of 000 . . . 00 every time the data of the change is generated. The Δ record is prepared in this manner.

Specifically, the remainder data (5 bytes) is added after the data of the change (11 bytes), because when the pattern of 0 or 1 with the same size is placed in the same position as the remainder by the division, the exclusive OR becomes 000 . . . 00. Therefore, as a result of the division by the generated polynomial G(x), a divisible pattern is prepared.

The Δ record is constantly divisible by the generated polynomial. Therefore, even if it is replaced with the area A of 000 . . . 00 of FIG. 17, as a result of the division, the remainder becomes 000 . . . 00, and there is no change. In the operation, even if it is successively replaced with the area B, area C . . . the result of the entire division, i.e., the remainder pattern becomes 000 . . . 00, and there is no change.

In this manner, even when a plurality of Δ records are present on the actual data area, data arrangement is along calculation of ECC encoding/decoding (division by the generated polynomial G(x)). This means that the Δ record can be read in the same manner as the ordinary data and that usual ECC encoding rules are observed, so that strong protection is provided.

The operation for processing internal data with the generated polynomial can be processed as the divider in hardware as shown in FIG. 15. However, the address conversion table, block status table, queue and the like are processed by the controller (microprocessor). Therefore, these data are preferably obtained by the calculating (software) operation by the controller which comprehensively manages these data.

The calculation can sufficiently be performed, for example, while the data transfer operation by the buffer controller is automatically performed without requiring the direct operation of the controller. For example, the buffer controller requires about 6 mS to transfer 16 sectors of data, and requires about 3 to 10 mS for the erasing operation of the flash memory. On the other hand, it takes about 800 $\mu$S at latest to prepare 16 bytes of Δ record. Therefore, even if the controller prepares the Δ record, it can be seen that a high-speed data writing operation can be operated without any problem.

Additionally, the process of preparing the Δ record is not limited to the generated polynomial G(x), and even a different formula may be applied. Moreover, a technique of Δ record is not limited to BCH code, and RS code having the similar function or the like may be used.

Moreover, in order to facilitate the description in the example, the pattern in which 000 . . . 00 continues has been described, but the pattern of 111 . . . 11 may be processed as it is without being processed by the inverter or the like.

Furthermore, in the above example, as the examples of the internal information, the address conversion table, block status table, queue and the like have been described, but the data which can be recorded as the Δ record are not limited to these information, and by the constitution mode or handled data of the memory manager, various information can be recorded, and reproduced.

Moreover, for an application range, the flash memory system of the present invention can be applied not only to a lap top computer and another computer system but also to a portable communication apparatus, digital camera and another multimedia system and other fields in which various data are handled.

As described above, according to the present invention, a flash memory system can be realized in which there is little delay in a writing/reading time, a writing operation can be performed relatively easily, a high-seed operation is realized, and defective sectors, defective bits and the like can adequately be managed.

What is claimed is:
1. A flash memory system, comprising:
 a memory manager configured to manage data transmission/reception between a host computer and a flash memory,
 wherein original data of initial internal information entered in said computer is stored on the flash memory, only information of subsequently changed portions are recorded as a Δ record, the Δ record being continuously recorded in a given region on the flash memory, and during a reset an entirety of the original data as entered in the computer and the Δ record are combined to form reconstructed data so that after the reset the resulting reconstructed data formed by combining the entirety of the original data and the Δ record is stored as new internal information on the flash memory.

2. The flash memory system according to claim 1, wherein said Δ record is successively stored as data indicative of subsequent changes with respect to an initial value of the original data in order to restore the internal information after the resetting event.

3. The flash memory system according to claim 1, wherein said Δ record has error correction code data.

4. The flash memory system of claim 1, wherein said Δ record is continuously written to a predetermined storage area.

5. The flash memory system according to claim 1, wherein said memory manager sets a size of a logical address area to be a portion of a physical address area, and
 said memory manager stores said Δ record in a surplus area of the physical address area which does not correspond to the logical address area.

6. The flash memory system according to claim 1, wherein said memory manager partitions the physical address and the logical address into blocks divided corresponding to a minimum erasing unit of the flash memory.

7. The flash memory system according to claim 1, wherein said memory manager has an address conversion table mutually configured to convert a logical block address and a physical block address, and the address conversation table and information of changes to the address conversion table are included in said Δ record.

8. The flash memory system according to claim 7, wherein:

said memory manager further has a block status table configured to store data indicating a state of said physical block on the flash memory, said data indicating at least whether or not the block is non-defective, whether or not a defective sector is present, and whether or not the block is used, and the block status table and information of changes to the block status table are included in said Δ record.

9. The flash memory system according to claim 5, wherein:

said memory manager has a queue in a use standby state in the surplus area of said physical address area not corresponding to the logical address area, and information of the queue is included in said Δ record.

10. The flash memory system according to claim 9, wherein:

when new data is written to the flash memory, said memory manager writes the new data in a predetermined block in the queue, and said memory manager stores the new data to a logical block address corresponding to a writing destination for the new data, and sets a writing destination block for the new data in the queue.

11. The flash memory system according to claim 10, wherein:

in a case where the writing destination block has data other than the new data and after transfer of a predetermined amount of said data transmission/reception from the host computer is completed, said memory manager transfers existing data in the writing destination block to the predetermined block in the queue.

12. The flash memory system according to claim 11, wherein when a defective section occurs in an arbitrary block in the physical address area, said memory manager replaces the arbitrary block in the physical address area with an arbitrary block in said queue.

13. The flash memory system according to claim 1, whereby the flash memory system is an IC chip.

14. The flash memory system according to claim 1, whereby the flash memory system is integral with the flash memory and is a card-shaped external storage system.

15. The flash memory system according to claim 2, wherein said Δ record has error correction code data.

16. The flash memory system of claim 2, wherein said Δ record is continuously written to a predetermined storage area.

17. The flash memory system of claim 3, wherein said Δ record is continuously written to a predetermined storage area.

18. The flash memory system according to claim 2, wherein said memory manager sets a size of a logical address are to be a portion of a physical address area, and said memory manager stores said Δ record in a surplus area of the physical address area which does not correspond to the logical address area.

19. The flash memory system according to claim 3, wherein said memory manager sets a size of a logical address area to be a portion of a physical address area, and said memory manager stores said Δ record in a surplus area of the physical address area which does not correspond to the logical address area.

20. The flash memory system according to claim 4, wherein said memory manager sets a size of a logical address area to be a portion of a physical address area as the actual address of the flash memory, and said memory manager stores said Δ record in a surplus area of the physical address area which does not correspond to the logical address area.

* * * * *